US012601790B2

(12) United States Patent
Yang et al.

(10) Patent No.: US 12,601,790 B2
(45) Date of Patent: Apr. 14, 2026

(54) BATTERY PARAMETER ESTIMATION APPARATUS AND METHOD

(71) Applicant: NuVolta Technologies (Hefei) Co., Ltd., Hefei (CN)

(72) Inventors: Muye Yang, Shanghai (CN); Kunxu Zhu, Shanghai (CN)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 590 days.

(21) Appl. No.: 18/153,536

(22) Filed: Jan. 12, 2023

(65) Prior Publication Data

US 2024/0094307 A1  Mar. 21, 2024

(51) Int. Cl.
*G01R 31/396* (2019.01)
*G01R 31/367* (2019.01)
*G01R 31/388* (2019.01)

(52) U.S. Cl.
CPC ......... *G01R 31/396* (2019.01); *G01R 31/367* (2019.01); *G01R 31/388* (2019.01)

(58) Field of Classification Search
CPC .. G01R 31/396; G01R 31/367; G01R 31/388; G01R 31/382; Y02E 60/10; H02J 7/0048; H02J 7/0049
USPC ....................................................... 320/132
See application file for complete search history.

(56) References Cited

U.S. PATENT DOCUMENTS 9,201,119 B2    12/2015  Baruzzi et al.
9,678,164 B2 *  6/2017   Mitsuyama .......... G01R 31/382

9,766,297 B2 *  9/2017   Frost .................... G01R 31/367
10,295,607 B2 * 5/2019   Baba .................. G01R 31/3648
11,740,290 B2 * 8/2023   Liaw .................... G01R 31/392
                                                        429/90
11,796,601 B2 * 10/2023  Jeong .................. G01R 31/382
12,392,834 B2 * 8/2025   Wang ................. G01R 31/3648

(Continued)

FOREIGN PATENT DOCUMENTS

CN        109061485 A      12/2018
CN        109116251 A       1/2019

(Continued)

OTHER PUBLICATIONS

C. Y. Chun, G.-S. Seo, S. H. Yoon and B.-H. Cho, "State-of-charge estimation for lithium-ion battery pack using reconstructed open-circuit-voltage curve," 2014 International Power Electronics Conference (Year: 2014).*

*Primary Examiner* — M Baye Diao
(74) *Attorney, Agent, or Firm* — AP3 Law Firm PLLC

(57)               ABSTRACT

A method includes applying a preliminary discharge/charge cycle to a plurality of battery cells to obtain an initial capacity of each battery cell, applying multiple small current discharge/charge cycles to the plurality of battery cells to minimize initial voltage deviations of the plurality of battery cells, configuring a first battery cell to be tested at a plurality of first testing points, configuring a second battery cell to be tested at a plurality of second testing points, and configuring a third battery cell to be tested at a plurality of third testing points, wherein the first battery cell, the second battery cell and the third battery cell are tested concurrently for generating an OCV-SOC curve, and the plurality of first testing points, the plurality of second testing points and the plurality of third testing points are arranged in an alternate manner.

20 Claims, 6 Drawing Sheets

(56)                References Cited

U.S. PATENT DOCUMENTS

2015/0357852 A1 *  12/2015  Nakao .................. H01M 10/48
                                                                      702/63
2017/0010327 A1 *   1/2017  Nishiguchi ........ G01R 31/3835
2023/0184815 A1 *   6/2023  Jeong .................. G01R 31/382
                                                                     320/107

FOREIGN PATENT DOCUMENTS

CN          109613438  A      4/2019
EP            2990818  A2 *   3/2016   ......... G01R 31/3648

* cited by examiner

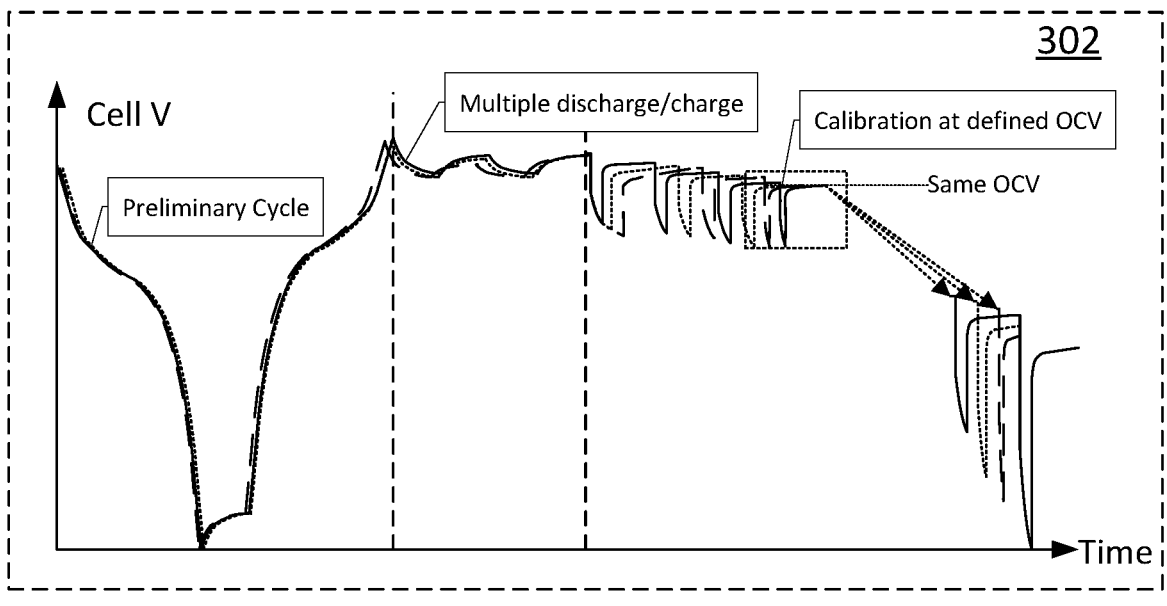
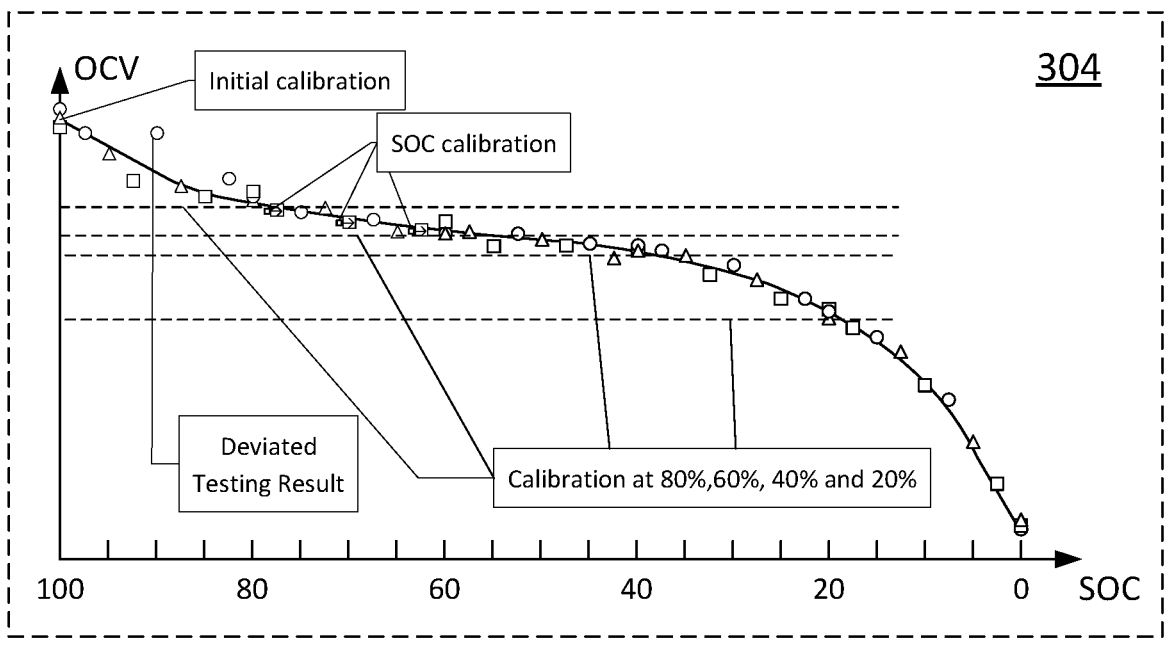
Figure 3

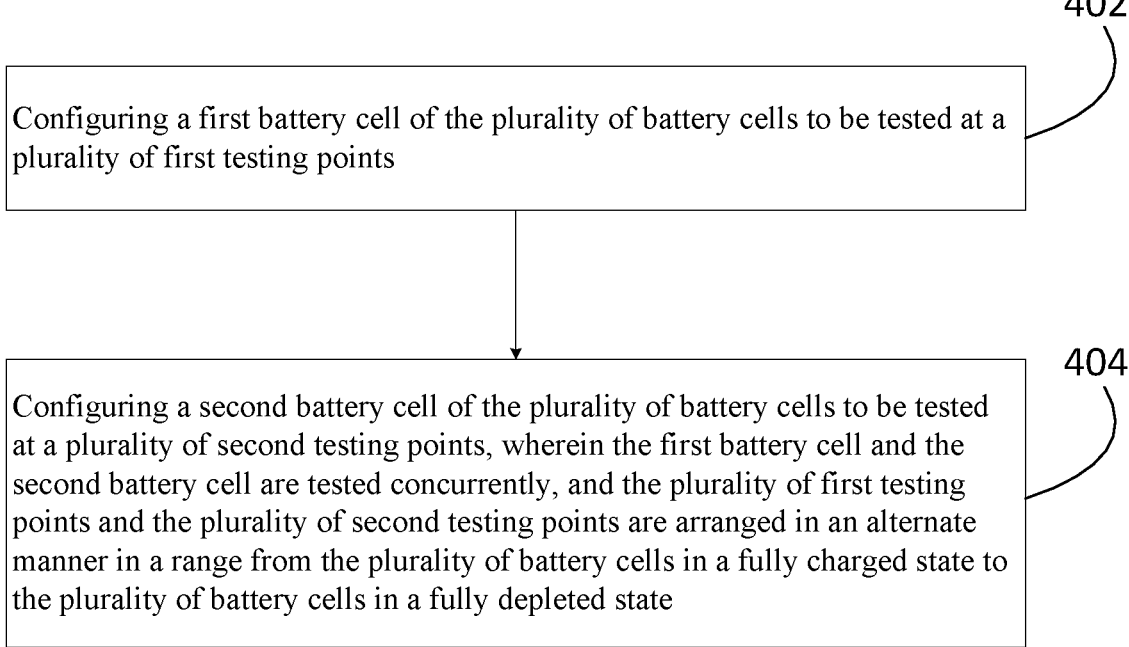

402

Configuring a first battery cell of the plurality of battery cells to be tested at a plurality of first testing points

404

Configuring a second battery cell of the plurality of battery cells to be tested at a plurality of second testing points, wherein the first battery cell and the second battery cell are tested concurrently, and the plurality of first testing points and the plurality of second testing points are arranged in an alternate manner in a range from the plurality of battery cells in a fully charged state to the plurality of battery cells in a fully depleted state

Figure 4

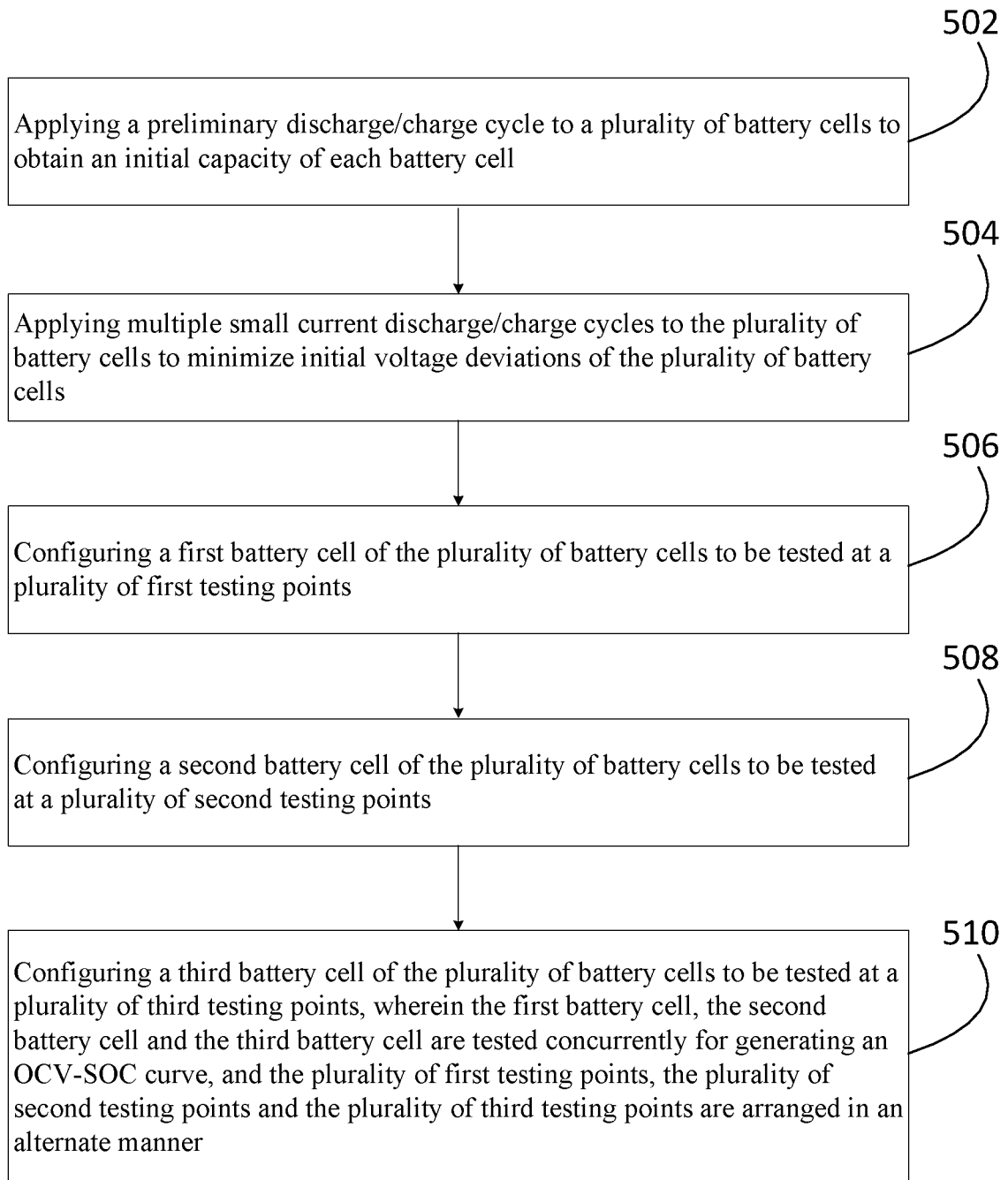

502

Applying a preliminary discharge/charge cycle to a plurality of battery cells to obtain an initial capacity of each battery cell

504

Applying multiple small current discharge/charge cycles to the plurality of battery cells to minimize initial voltage deviations of the plurality of battery cells

506

Configuring a first battery cell of the plurality of battery cells to be tested at a plurality of first testing points

508

Configuring a second battery cell of the plurality of battery cells to be tested at a plurality of second testing points

510

Configuring a third battery cell of the plurality of battery cells to be tested at a plurality of third testing points, wherein the first battery cell, the second battery cell and the third battery cell are tested concurrently for generating an OCV-SOC curve, and the plurality of first testing points, the plurality of second testing points and the plurality of third testing points are arranged in an alternate manner

Figure 5

BATTERY PARAMETER ESTIMATION APPARATUS AND METHOD

PRIORITY CLAIM

This application claims priority to Chinese Patent Application No. 202211139714.1, filed on Sep. 20, 2022, which is hereby incorporated by reference in its entirety.

TECHNICAL FIELD

The present invention relates to an apparatus and method for generating an OCV-SOC curve, and, in particular embodiments, to a method for efficiently generating the OCV-SOC curve through testing a plurality of battery cells concurrently.

BACKGROUND

As technologies further advance, a variety of electronic devices, such as mobile phones, tablet PCs, smart watches, wireless earbuds, virtual reality (VR) devices and/or the like, have become popular. In a portable device, it is difficult to measure residual energy accumulated in the battery. Meanwhile, it is very important for a user of the portable device to know the information about how much the energy remains and how long the portable device can be used.

A state of charge (SOC) of the battery indicates the energy remained in the battery. A power battery management system (BMS) is employed to measure various parameters of the battery, and estimate the SOC of the battery based on the measured parameters. The open circuit voltage (OCV)-battery SOC estimation method is a well-known method to achieve a reliable SOC estimation. The OCV of a battery cell is the potential difference between the positive and negative terminals of the battery cell when no current flows, and the battery cell has been at rest for a predetermined period. The OCV based battery SOC estimation method relies on an OCV-SOC curve to estimate the remaining energy in the battery cell.

The OCV-SOC curve is a very important part for estimating the SOC of a battery. Obtaining a SOC-OCV relationship curve suitable for various situations is the basis for accurately estimating the SOC of a battery.

A battery cell can be fully charged by a constant current and a constant voltage charging control schemes. After the battery cell is fully charged, the SOC is 100% of SOC. In order to obtain the OCV-SOC curve, the battery cell is sequentially placed in different ambient temperatures and is discharged by a constant current discharge method. Every time after the SOC of the battery cell is lowered down by a certain SOC, the discharging process is stopped. Once the battery cell has been rested for a predetermined period (e.g., one hour), the OCV value is collected. The process is repeated to collect a plurality of OCV values in different ambient temperatures and different SOC values. Based on the measured OCV values and SOC values, an OCV-SOC curve is obtained.

The OCV characterization process described above is very time consuming. It would be desirable to have a simple and efficient way to generate an accurate OCV-SOC curve. The present disclosure addresses this need.

SUMMARY

These and other problems are generally solved or circumvented, and technical advantages are generally achieved, by preferred embodiments of the present disclosure which provide a method for efficiently generating the OCV-SOC curve through testing a plurality of battery cells concurrently.

In accordance with an embodiment, a method for characterizing a plurality of battery cells comprises configuring a first battery cell of the plurality of battery cells to be tested at a plurality of first testing points, and configuring a second battery cell of the plurality of battery cells to be tested at a plurality of second testing points, wherein the first battery cell and the second battery cell are tested concurrently, and the plurality of first testing points and the plurality of second testing points are arranged in an alternate manner in a range from the plurality of battery cells in a fully charged state to the plurality of battery cells in a fully depleted state.

In accordance with another embodiment, a method comprises applying a preliminary discharge/charge cycle to a plurality of battery cells to obtain an initial capacity of each battery cell, applying multiple small current discharge/charge cycles to the plurality of battery cells to minimize initial voltage deviations of the plurality of battery cells, configuring a first battery cell of the plurality of battery cells to be tested at a plurality of first testing points, configuring a second battery cell of the plurality of battery cells to be tested at a plurality of second testing points, and configuring a third battery cell of the plurality of battery cells to be tested at a plurality of third testing points, wherein the first battery cell, the second battery cell and the third battery cell are tested concurrently for generating an OCV-SOC curve, and the plurality of first testing points, the plurality of second testing points and the plurality of third testing points are arranged in an alternate manner.

In accordance with yet another embodiment, an apparatus comprises a voltage sensor configured to measure OCV values of each battery cell of a plurality of battery cells configured to be tested concurrently in a chamber, a current sensor configured to measure current values of each battery cell of the plurality of battery cells, and a control circuit configured to receive measured OCV values and measured current values of the plurality of battery cells, generate an OCV-SOC curve for each battery cell and merge OCV-SOC curves of the plurality of battery cells into a single OCV-SOC curve.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 3 illustrates a second implementation of the method for generating the OCV-SOC curve in accordance with various embodiments of the present disclosure;

FIG. 4 illustrates a flow chart showing a method of generating the OCV-SOC curve in accordance with various embodiments of the present disclosure;

FIG. 5 illustrates a flow chart showing another method of generating the OCV-SOC curve in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a method for efficiently generating an OCV-SOC curve through testing a plurality of battery cells concurrently. The disclosure may also be applied, however, to estimating various battery parameters such as an internal resistance of a battery. Hereinafter, various embodiments will be explained in detail with reference to the accompanying drawings.

Figure 1:
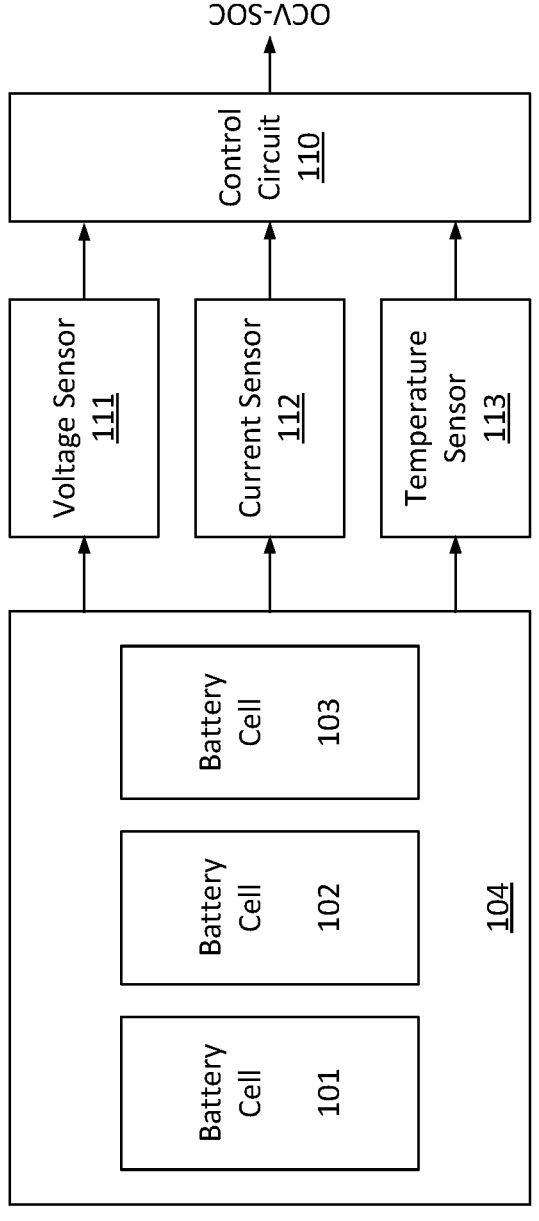
FIG. 1 illustrates a block diagram of an apparatus for testing a plurality of battery cells and generating an OCV-SOC curve in accordance with various embodiments of the present disclosure.

FIG. 1 illustrates a block diagram of an apparatus for testing a plurality of battery cells and generating an OCV-SOC curve in accordance with various embodiments of the present disclosure. A plurality of battery cells is placed in a chamber 104. For simplicity, only a first battery cell 101, a second battery cell 102 and a third battery cell 103 of the plurality of battery cells are shown in FIG. 1.

It should be noted that three battery cells shown in FIG. 1 are merely an example. Any number of battery cells may be tested for generating the OCV-SOC curve. The present disclosure is not limited to any specific number of battery cells.

As shown in FIG. 1, a voltage sensor 111 is configured to measure an open circuit voltage (OCV) of each battery cell. The voltage sensor 111 may be implemented using a voltage measurement circuit commonly used in the art (e.g., a source measure unit). A current sensor 112 is configured to measure a current flowing through each battery cell. The current sensor 112 may be implemented using a current measurement circuit commonly used in the art (e.g., a source measure unit). A temperature sensor 113 is configured to measure a temperature inside the chamber 104. The temperature sensor 113 may be implemented using a thermo measurement circuit commonly used in the art (e.g., a digital multi-meter).

It should be noted that the single voltage sensor, the single current sensor and the signal temperature sensor shown in FIG. 1 are merely an example. Depending on different applications and design needs, additional sensors may be used to fulfill the measurement requirements.

The outputs of the voltage sensor 111, the current sensor 112 and the temperature sensor 113 are connected to a control circuit 110. The outputs of these three sensors transmit data measured from the battery cells 101, 102 and 103 to the control circuit 110.

The control circuit 110 is configured to generate an OCV-SOC curve for each battery cell based on the measured data sent from the three sensors. Furthermore, the control circuit 110 merges the OCV-SOC curves of the plurality of battery cells into a single OCV-SOC curve. This single OCV-SOC curve is used in SOC estimation and other suitable battery management system (BMS) applications.

The control circuit 110 may be implemented as a processor, an Application-Specific Integrated Circuit (ASIC), a logic circuit, a register, a digital signal processor (DSP), any combination thereof to perform the above-described operation.

In operation, the battery cells 101, 102 and 103 are tested concurrently in the chamber 104. In particular, the battery cells 101, 102 and 103 are set at 100% of SOC after various preliminary discharge/charge cycles are applied to these three battery cells.

In operation, the first battery cell 101 is tested at a plurality of first testing points. In some embodiments, the plurality of first testing points is obtained by dividing the SOC of the first battery cell in a unit of 7.5% between 97.5% and 0% of the SOC of the first battery cell 101. The second battery cell 102 is tested at a plurality of second testing points. In some embodiments, the plurality of second testing points is obtained by dividing the SOC of the second battery cell in a unit of 7.5% between 95% and 5% of the SOC of the second battery cell 102. The third battery cell 103 is tested at a plurality of third testing points. In some embodiments, the plurality of third testing points is obtained by dividing the SOC of the third battery cell in a unit of 7.5% between 92.5% and 2.5% of the SOC of the third battery cell 103.

In some embodiments, the plurality of first testing points of the first battery cell 101, the plurality of second testing points of the second battery cell 102 and the plurality of third testing points of the third battery cell 103 are arranged in an alternate manner in a range from the plurality of battery cells in a fully charged state (100% of the SOC) to the plurality of battery cells in a fully depleted state (0% of the SOC).

In operation, a pulse current source is used to set a new SOC. In particular, once the OCV value of a battery cell (e.g., first battery cell 101) at a previous SOC has been measured, the pulse current source is turned on to discharge the battery cell to a new SOC. The current sensor is employed to monitor the current flowing through the battery cell. Based on the current flowing the battery and the discharge time, the control circuit 110 is able to determine the new SOC value of the battery cell. At this new SOC, the OCV testing result is obtained by applying a voltage relaxation method. In particular, after the battery cell has been discharged to this new SOC, an OCV of the battery cell at this new SOC is measured after resting the battery cell for a predetermined period.

In operation, the first battery cell 101 is tested at the plurality of first testing points. Once the control circuit 110 has acquired the OCV testing results and the SOC testing results at the plurality of first testing points, the control circuit 110 is able to generate a first OCV-SOC curve for the first battery cell 101 based on the OCV testing results and the SOC testing results measured at the plurality of first testing points.

Likewise, the second battery cell 102 is tested at the plurality of second testing points. Once the control circuit 110 has acquired the OCV testing results and the SOC testing results at the plurality of second testing points, the control circuit 110 is able to generate a second OCV-SOC curve for the second battery cell 102 based on the OCV testing results and the SOC testing results measured at the plurality of second testing points.

The third battery cell 103 is tested at the plurality of third testing points. Once the control circuit 110 has acquired the OCV testing results and the SOC testing results at the plurality of third testing points, the control circuit 110 is able to generate a third OCV-SOC curve for the third battery cell 103 based on the OCV testing results and the SOC testing results measured at the plurality of third testing points.

The plurality of first testing points, the plurality of second testing points and the plurality of third testing points are arranged in an alternate manner in a range from 100% of the SOC to 0% of the SOC. The battery cells 101, 102 and 103 are tested concurrently to generate the OCV and SOC testing results from 100% of the SOC to 0% of the SOC. Once the three OCV-SOC curves are available, the control circuit 110 is able to merge the OCV-SOC curves into a single OCV-SOC curve. The single OCV-SOC curve is used in SOC estimation and other suitable BMS applications. The detailed processes of generating the OCV-SOC curve will be described below with respect to FIGS. 2 and 3.

In operation, according to a conventional way to characterize a battery cell, the battery cell is tested at 40 testing points in a range from 100% of SOC to 0% of SOC. In addition, the charge characterization has to be performed on seven different temperatures including −20 degrees, −10 degrees, 0 degrees, 10 degrees, 25 degrees, 40 degrees and 50 degrees. The discharge characterization has to be performed on five different temperatures including 0 degrees, 10 degrees, 25 degrees, 40 degrees and 50 degrees. As such, the battery cell is tested at 12 different temperatures. At each temperature, there are 40 testing points. In total, the battery cell is tested about 480 times (480 charge or discharge processes). At each charge/discharge process, the rest time for the battery cell is about one hour. Therefore, the total characterization time is about 20 days. In contrast, according to the method described above, the testing points at each temperature is about one third of that in the conventional way. As such, the total characterization time is about 8.5 days.

One advantageous feature of having the apparatus shown in FIG. 1 is that the control circuit 110 is able to efficiently generate an OCV-SOC curve through testing three battery cells concurrently. A conventional way to generating the OCV-SOC curve is based on testing one single battery cell. The single battery cell is tested at a predetermined number of testing points using the voltage relaxation method. The voltage relaxation method, however, is time consuming (e.g., about 20 days to complete the tests for generating the OCV-SOC curve). In the present disclosure, the predetermined number of testing points are split among three battery cells. The three battery cells are tested concurrently. The number of testing points applied to each of these three battery cells is about one third of the testing points used in the conventional way. By reducing the testing points and testing the three battery cells concurrently, the testing efficiency can be significantly improved (e.g., testing time is reduced from about 20 days to about 8.5 days).

Figure 2:
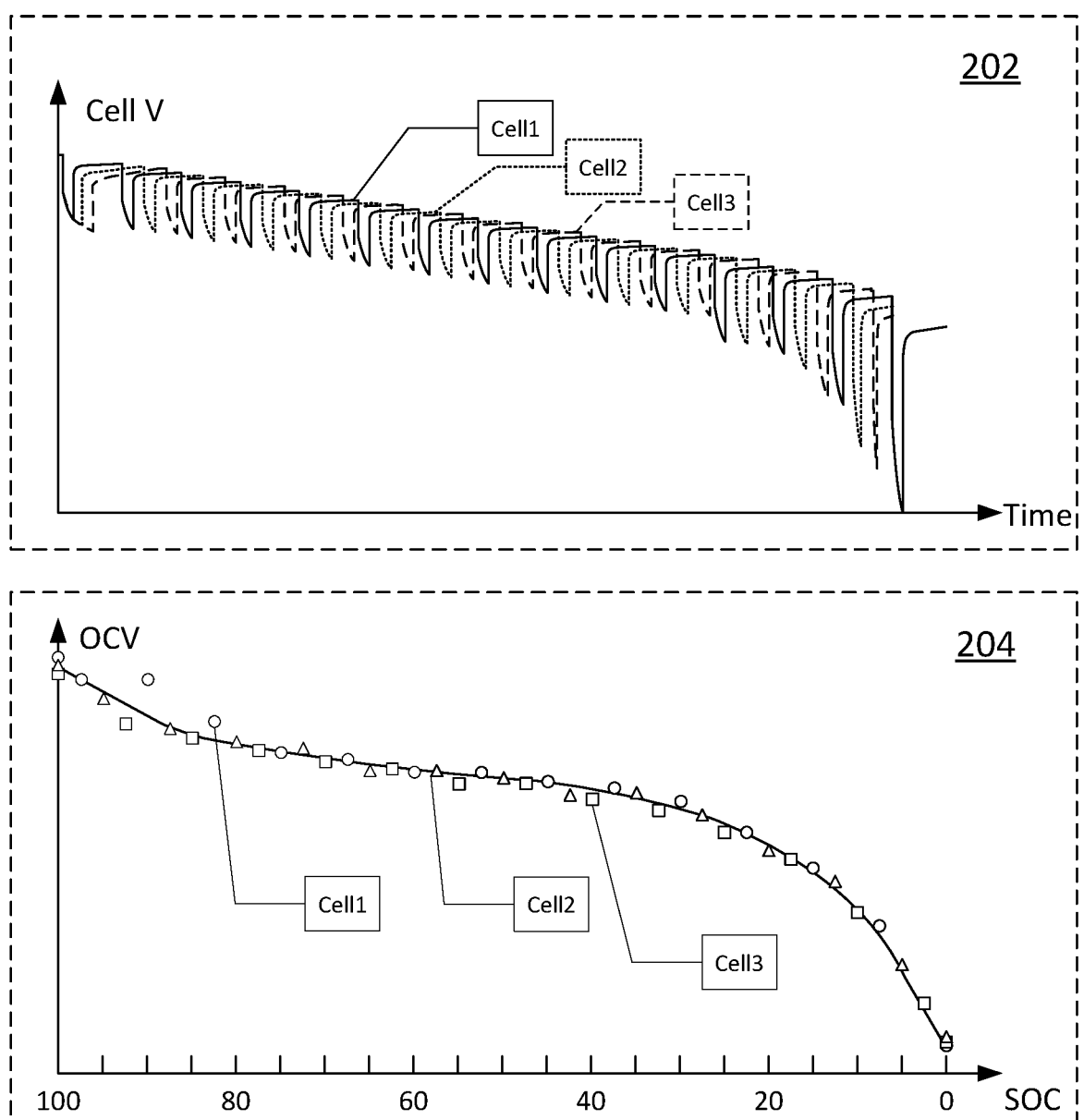
FIG. 2 illustrates a first implementation of a method for generating the OCV-SOC curve in accordance with various embodiments of the present disclosure.

FIG. 2 illustrates a first implementation of a method for generating the OCV-SOC curve in accordance with various embodiments of the present disclosure. The first battery cell 101 shown in FIG. 1 is referred to as Cell 1 in FIG. 2. The second battery cell 102 shown in FIG. 1 is referred to as Cell 2 in FIG. 2. The third battery cell 103 shown in FIG. 1 is referred to as Cell 3 in FIG. 2. The curves in the dashed rectangle 202 represent the discharge process of each battery cell from 100% of SOC to 0% of SOC. In the dashed rectangle 202, the horizontal axis represents intervals of time. The vertical axis represents the open circuit voltages of the three battery cells.

In operation, the first testing point of Cell 1 is 100% of the SOC of Cell 1. Once the OCV value of Cell 1 at the first testing point has been measured, a pulse current is used to discharge Cell 1 with a predetermined C-rate from 100% of SOC to a next SOC (e.g., 97.5% of SOC). At each testing point of Cell 1, the corresponding OCV value of Cell 1 is measured using the voltage relaxation method. The SOC value is calculated based on the current flowing through Cell 1 and the discharge time. Once both the OCV and SOC values have been obtained, the control circuit is configured to proceed with the next SOC using the same process described above. The plurality of first testing points of Cell 1 is shown in the first column of Table 1 below.

Likewise, the first testing point of Cell 2 is 100% of the SOC of Cell 2. Once the OCV value of Cell 2 at the first testing point has been measured, a pulse current is used to discharge Cell 2 with a predetermined C-rate from 100% of SOC to a next SOC (e.g., 95% of SOC). At each testing point of Cell 2, the corresponding OCV value of Cell 2 is measured using the voltage relaxation method. The SOC value is calculated based on the current flowing through Cell 2 and the discharge time. Once both the OCV and SOC values have been obtained, the control circuit is configured to proceed with the next SOC using the same process described above. The plurality of second testing points of Cell 2 is shown in the second column of Table 1 below.

The first testing point of Cell 3 is 100% of the SOC of Cell 3. Once the OCV value of Cell 3 at the first testing point has been measured, a pulse current is used to discharge Cell 3 with a predetermined C-rate from 100% of SOC to a next SOC (e.g., 92.5% of SOC). At each testing point of Cell 3, the corresponding OCV value of Cell 3 is measured using the voltage relaxation method. The SOC value is calculated based on the current flowing through Cell 3 and the discharge time. Once both the OCV and SOC values have been obtained, the control circuit is configured to proceed with the next SOC using the same process described above. The plurality of third testing points of Cell 3 is shown in the third column of Table 1 below.

Table 1 shows the testing points for each battery cell. In Table 1, the numbers (e.g., 100) represent SOC values. For example, a testing point of 100 indicates the OCV and SOC values are obtained at 100% of SOC.

TABLE 1

| Cell 1 | Cell 2 | Cell 3 |
|--------|--------|--------|
| 100 | 100 | 100 |
| 97.5 | 95 | 92.5 |

TABLE 1-continued

| Cell 1 | Cell 2 | Cell 3 |
|---|---|---|
| 90 | 87.5 | 85 |
| 82.5 | 80 | 77.5 |
| 75 | 72.5 | 70 |
| 67.5 | 65 | 62.5 |
| 60 | 57.5 | 55 |
| 52.5 | 50 | 47.5 |
| 45 | 42.5 | 40 |
| 37.5 | 35 | 32.5 |
| 30 | 27.5 | 25 |
| 22.5 | 20 | 17.5 |
| 15 | 12.5 | 10 |
| 7.5 | 5 | 2.5 |
| 0 | 0 | 0 |

As shown in Table 1, Cell 1 is tested at a plurality of first testing points including 100, 97.5, 90, 82.5, 75, 67.5, 60, 52.5, 45, 37.5, 30, 22.5, 15, 7.5 and 0. The plurality of first testing points of Cell 1 is obtained by dividing the SOC of Cell 1 in a unit of 7.5% between 97.5% and 0% of the SOC of Cell 1.

Cell 2 is tested at a plurality of second testing points including 100, 95, 87.5, 80, 72.5, 65, 57.5, 50, 42.5, 35, 27.5, 20, 12.5, 5 and 0. The plurality of second testing points of Cell 2 is obtained by dividing the SOC of Cell 2 in a unit of 7.5% between 95% and 5% of the SOC of Cell 2.

Cell 3 is tested at a plurality of third testing points including 100, 92.5, 85, 77.5, 70, 62.5, 55, 47.5, 40, 32.5, 25, 17.5, 10, 2.5 and 0. The plurality of third testing points of Cell 3 is obtained by dividing the SOC of Cell 3 in a unit of 7.5% between 92.5% and 2.5% of the SOC of Cell 3. As shown in Table 1, the plurality of first testing points of Cell 1, the plurality of second testing points of Cell 2 and the plurality of third testing points of Cell 3 are arranged in an alternate manner. It should be noted that once the testing results of the three battery cells are merged into one single OCV-SOC curve, the testing points are in a range from 100% of SOC to 0% of SOC, and the gap between two adjacent testing points is 2.5% of SOC.

The OCV and SOC testing results of the three battery cells are shown in the dashed rectangle 204. The horizontal axis in the dashed rectangle 204 represents SOC values. The vertical axis in the dashed rectangle 204 represents the OCV testing results of the three battery cells. In the dashed rectangle 204, the circles represents the OCV testing results of Cell 1. The triangles represents the OCV testing results of Cell 2. The squares represents the OCV testing results of Cell 3.

As shown in FIG. 2, the OCV testing results of the three battery cells are distributed in an alternate manner. In some embodiments, the circles in the dashed rectangle 204 form a first OCV-SOC curve. The triangles in the dashed rectangle 204 form a second OCV-SOC curve. The squares in the dashed rectangle 204 form a third OCV-SOC curve. By using a suitable data estimation technique (e.g., interpolation), the three OCV-SOC curves can be merged into a single OCV-SOC curve to be used in SOC estimation applications.

One advantageous feature of having a single OCV-SOC curve is that the single OCV-SOC curve helps to improve SOC estimation accuracy. More particularly, the deviation in the OCV data of each battery cell can be eliminated through merging the data of the three battery cells.

FIG. 3 illustrates a second implementation of the method for generating the OCV-SOC curve in accordance with various embodiments of the present disclosure. The second implementation shown in FIG. 3 is similar to the first implementation shown in FIG. 2 except the following five differences.

First, as shown in the dashed rectangle 302, a preliminary discharge/charge cycle is applying to the threes battery cells prior to testing the three battery cells. As shown in FIG. 3, during the preliminary discharge/charge cycle, each battery cell is discharged from an SOC of 100% to an SOC of 0%, and then each battery cell is charged from the SOC of 0% to the SOC of 100%. The initial capacity of each battery cell is calculated based on testing results of the preliminary discharge/charge cycle.

Second, prior to testing the three battery cells, multiple small current discharge/charge cycles are applied to the three battery cells. As a result of applying the multiple small current discharge/charge cycles to the three battery cells, initial voltage deviations of the three battery cells are controlled within a predetermined voltage deviation range. In some embodiments, the predetermined voltage deviation range is from about −2 mV to about 2 mV.

Third, each battery cell (e.g., Cell 1) is characterized using a plurality of testing points (e.g., testing points of Cell 1 shown in the first column of Table 2 below) to obtain a plurality of SOC testing results based on the initial capacity obtained in the preliminary discharge/charge cycle. After the characterization process of each battery cell is complete, an updated capacity of each battery cell is calculated based on the plurality of SOC testing results. Based on the updated capacity, the SOC values of each battery cell is recalculated to improve the measurement accuracy.

In some embodiments, based on the testing result obtained in the preliminary discharge/charge cycle, the initial capacity of a battery cell may be a certain mAh (e.g., 2000 mAh). The measured capacity in the preliminary discharge/charge cycle is different from the capacity in the multiple discharge/charge processes. To have better accuracy of the SOC, the nominal capacity of each cell is updated after the characterization is complete. In particular, during the discharge process of this battery cell, the control circuit records the capacity drop at each SOC point. After the battery cell has been fully discharged, the control circuit can count the updated capacity by adding all capacity drops together. For example, the sum of the capacity drops may be a different mAh (e.g., 2050 mAh). Then, the newly measured result (e.g., 2050 mAh) can be used as the updated capacity to recalculate the SOC testing results.

Fourth, a plurality of calibration testing points are employed to reset SOC integration errors in subsequent SOC characterization steps. For example, as shown in Table 2 below, a first calibration testing point (e.g., 80 in the first column of Table 2) is placed in the plurality of first testing points of Cell 1. A second calibration testing point (e.g., 80 in the second column of Table 2) is placed in the plurality of second testing points of Cell 2. A third calibration testing point (e.g., 80 in the third column of Table 2) is placed in the plurality of third testing points of Cell 3. In operation, according to a previously known OCV-SOC relationship, the three battery cells are discharged to a same OCV related to 80% of SOC. During the discharge process of Cell 1, the control circuit is configured to obtain a first SOC of Cell 1 based on the discharge current flowing through Cell 1 and the discharge time. Likewise, during the discharge process of Cell 2, the control circuit is configured to obtain a second SOC of Cell 2 based on the discharge current flowing through Cell 2 and the discharge time. During the discharge process of Cell 3, the control circuit is configured to obtain a third SOC of Cell 3 based on the discharge current flowing through Cell 3 and the discharge time. Then, the control circuit is configured to determine whether the first SOC of Cell 1, the second SOC of Cell 2 and the third SOC of Cell 3 are evenly distributed around the predetermined calibration SOC (e.g., 80% of SOC). If the first SOC, the second SOC and the third SOC are evenly distributed around the predetermined calibration SOC, an average value of the first SOC, the second SOC and the third SOC is used to replace the first SOC, the second SOC and the third SOC so as to reset SOC integration errors in subsequent SOC characterization steps. If the first SOC, the second SOC and the third SOC are unevenly distributed, a deviated SOC is deleted and adjacent SOC testing results are recalculated.

In some embodiments, among three SOC testing results, one is the median SOC. A deviated SOC is defined as an SOC away from the median SOC. For example, if the difference between an SOC (e.g., a first SOC testing result) and the median SOC (e.g., a second SOC testing result) is at least 1.5 times greater than the difference between the other SOC (e.g., a third SOC testing result) and the median SOC, the SOC (e.g., a first SOC testing result) is a deviated SOC.

In operation, if the first SOC of Cell 1 is a deviated SOC, the first SOC will be replaced by the average of the second SOC and the third SOC. In addition, at least half of the SOC values obtained before the first SOC should be recalculated so as to reset SOC integration errors. In Table 2 below, for Cell 1, there are four SOC values between 100% of SOC and 80% of SOC. If the first SOC of Cell 1 at 80% of SOC is a deviated SOC, at least the SOC values at 90% and 82.5% SOC should be recalculated to improve measurement accuracy.

Fifth, the control circuit is configured to filter out OCV testing results deviated from adjacent OCV testing results to improve measurement accuracy. According to the characteristics of the battery cell, the OCV-SOC relationship is linear within a short range. However, due to various factors such as equipment errors, the OCV testing results may be deviated away from the linear curve within the short range. For example, in the dashed rectangle 304, the circle deviated from the adjacent testing results is filtered out to improve measurement accuracy.

Table shows the testing points for each battery cell. In Table 2, the numbers (e.g., 100) represent SOC values. For example, a testing point of 100 indicates the OCV and SOC values are obtained at 100% of SOC.

TABLE 2

| Cell 1 | Cell 2 | Cell 3 |
|---|---|---|
| 100 | 100 | 100 |
| 97.5 | 95 | 92.5 |
| 90 | 87.5 | 85 |
| 82.5 | 80 | 80 |
| 80 | 72.5 | 77.5 |
| 75 | 65 | 70 |
| 67.5 | 60 | 62.5 |
| 60 | 57.5 | 60 |
| 52.5 | 50 | 55 |
| 45 | 42.5 | 47.5 |
| 40 | 40 | 40 |
| 37.5 | 35 | 32.5 |
| 30 | 27.5 | 25 |
| 22.5 | 20 | 20 |
| 20 | 12.5 | 17.5 |
| 15 | 5 | 10 |
| 7.5 | 0 | 2.5 |
| 0 | | 0 |

As show in Table 2, Cell 1 is tested at a plurality of first testing points including 100, 97.5, 90, 82.5, 80, 75, 67.5, 60, 52.5, 45, 40, 37.5, 30, 22.5, 20, 15, 7.5 and 0. In comparison with the first testing points shown in Table 1, testing points 80, 40 and 20 are newly added. Test points 80, 60, 40 and 20 in the first testing points function as SOC calibration testing points.

Cell 2 is tested at a plurality of second testing points including 100, 95, 87.5, 80, 72.5, 65, 60, 57.5, 50, 42.5, 40, 35, 27.5, 20, 12.5, 5 and 0. In comparison with the second testing points shown in Table 1, testing points 60 and 40 are newly added. Test points 80, 60, 40 and 20 in the second testing points function as SOC calibration testing points.

Cell 3 is tested at a plurality of third testing points including 100, 92.5, 85, 80, 77.5, 70, 62.5, 60, 55, 47.5, 40, 32.5, 25, 20, 17.5, 10, 2.5 and 0. In comparison with the third testing points shown in Table 1, testing points 80, 60 and 20 are newly added. Test points 80, 60, 40 and 20 in the third testing points function as SOC calibration testing points.

The OCV and SOC testing results of the three battery cells are shown in the dashed rectangle 304. The horizontal axis in the dashed rectangle 304 represents SOC values. The vertical axis in the dashed rectangle 304 represents the OCV testing results of the three battery cells. In the dashed rectangle 304, the circles represents the OCV testing results of Cell 1. The triangles represents the OCV testing results of Cell 2. The squares represents the OCV testing results of Cell 3.

In some embodiments, the circles in the dashed rectangle 304 form a first OCV-SOC curve. The triangles in the dashed rectangle 304 form a second OCV-SOC curve. The squares in the dashed rectangle 304 form a third OCV-SOC curve. By using a suitable data estimation technique (e.g., interpolation), the three OCV-SOC curves can be merged into a single OCV-SOC curve to be used in SOC estimation applications.

FIG. 4 illustrates a flow chart showing a method of generating the OCV-SOC curve in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged and repeated.

Referring back to FIG. 1, a voltage sensor is configured to measure OCV values of a plurality of battery cells (e.g., three battery cells shown in FIG. 1). The three battery cells are tested concurrently in a chamber. A current sensor is configured to measure current values of each battery cell of these three battery cells. A control circuit is configured to receive measured OCV values and measured current values of the three battery cells, generate an OCV-SOC curve for each battery cell and merge OCV-SOC curves of the three battery cells into a single OCV-SOC curve.

At step 402, a first battery cell of the plurality of battery cells is configured to be tested at a plurality of first testing points.

At step 404, a second battery cell of the plurality of battery cells is configured to be tested at a plurality of second testing points. The first battery cell and the second battery cell are tested concurrently, and the plurality of first testing points and the plurality of second testing points are arranged in an alternate manner in a range from the plurality of battery cells in a fully charged state to the plurality of battery cells in a fully depleted state.

The method further comprises configuring a third battery cell of the plurality of battery cells to be tested at a plurality of third testing points, wherein the first battery cell, the second battery cell and the third battery cell are tested concurrently, and the plurality of first testing points, the plurality of second testing points and the plurality of third testing points are arranged in another alternate manner.

Referring back to FIG. 2, in Table 1, the plurality of first testing points are obtained by dividing an SOC of the first battery cell in a unit of 7.5% between 97.5% and 0% of the SOC of the first battery cell. The plurality of second testing points are obtained by dividing an SOC of the second battery cell in a unit of 7.5% between 95% and 5% of the SOC of the second battery cell. The plurality of third testing points are obtained by dividing an SOC of the third battery cell in a unit of 7.5% between 92.5% and 2.5% of the SOC of the third battery cell.

The method further comprises prior to characterizing the plurality of battery cells, applying a preliminary discharge/charge cycle to the plurality of battery cells, and calculating an initial capacity of each battery cell based on testing results of the preliminary discharge/charge cycle.

The method further comprises characterizing the first battery cell using the plurality of first testing points to obtain a plurality of SOC testing results based on the initial capacity obtained in the preliminary discharge/charge cycle, after characterizing the first battery cell, calculating an updated capacity of the first battery cell based on the plurality of SOC testing results, and recalculating the plurality of SOC testing results based on the updated capacity of the first battery cell.

The method further comprises prior to characterizing the plurality of battery cells, applying multiple small current discharge/charge cycles to the plurality of battery cells, wherein as a result of applying the multiple small current discharge/charge cycles to the plurality of battery cells, initial voltage deviations of the plurality of battery cells are controlled within a predetermined voltage deviation range.

The method further comprises configuring a third battery cell of the plurality of battery cells to be tested at a plurality of third testing points, placing a first calibration testing point in the plurality of first testing points, placing a second calibration testing point in the plurality of second testing points, and placing a third calibration testing point in the plurality of third testing points, wherein the first calibration testing point, the second calibration testing point and the third calibration testing point are of a same open circuit voltage (OCV).

The method further comprises obtaining a first SOC of the first battery cell through discharging the first battery cell to the same open circuit voltage, obtaining a second SOC of the second battery cell through discharging the second battery cell to the same open circuit voltage, obtaining a third SOC of the third battery cell through discharging the third battery cell to the same open circuit voltage, and determining whether the first SOC, the second SOC and the third SOC are evenly distributed. If the first SOC, the second SOC and the third SOC are evenly distributed, an average value of the first SOC, the second SOC and the third SOC is used to replace the first SOC, the second SOC and the third SOC to reset SOC integration errors in subsequent SOC characterization steps. If the first SOC, the second SOC and the third SOC are unevenly distributed, a deviated SOC is deleted and adjacent SOC testing results are recalculated.

The method further comprises configuring a third battery cell of the plurality of battery cells to be tested at a plurality of third testing points, obtaining a plurality of first OCV testing results and a plurality of first SOC testing results through testing the first battery cell at the plurality of first testing points, obtaining a plurality of second OCV testing results and a plurality of second SOC testing results through testing the second battery cell at the plurality of second testing points, obtaining a plurality of third OCV testing results and a plurality of third SOC testing results through testing the third battery cell at the plurality of third testing points, obtaining a first OCV-SOC curve characterizing a OCV and SOC relationship of the first battery cell based on the plurality of first OCV testing results and the plurality of first SOC testing results, obtaining a second OCV-SOC curve characterizing a OCV and SOC relationship of the second battery cell based on the plurality of second OCV testing results and the plurality of second SOC testing results, obtaining a third OCV-SOC curve characterizing a OCV and SOC relationship of the third battery cell based on the plurality of third OCV testing results and the plurality of third SOC testing results, filtering out OCV testing results deviated from adjacent OCV testing results, and merging the first OCV-SOC curve, the second OCV-SOC curve and the third OCV-SOC curve into a single OCV-SOC curve based on a linear interpolation.

FIG. 5 illustrates a flow chart showing another method of generating the OCV-SOC curve in accordance with various embodiments of the present disclosure. This flowchart shown in FIG. 5 is merely an example, which should not unduly limit the scope of the claims. One of ordinary skill in the art would recognize many variations, alternatives, and modifications. For example, various steps illustrated in FIG. 5 may be added, removed, replaced, rearranged and repeated.

Referring back to FIG. 1, a voltage sensor is configured to measure OCV values of a plurality of battery cells (e.g., three battery cells shown in FIG. 1). The three battery cells are tested concurrently in a chamber. A current sensor is configured to measure current values of each battery cell of these three battery cells. A control circuit is configured to receive measured OCV values and measured current values of the three battery cells, generate an OCV-SOC curve for each battery cell and merge OCV-SOC curves of the three battery cells into a single OCV-SOC curve.

At step 502, a preliminary discharge/charge cycle is applied to a plurality of battery cells to obtain an initial capacity of each battery cell.

At step 504, multiple small current discharge/charge cycles are applied to the plurality of battery cells to minimize initial voltage deviations of the plurality of battery cells.

At step 506, a first battery cell of the plurality of battery cells is configured to be tested at a plurality of first testing points.

At step 508, a second battery cell of the plurality of battery cells is configured to be tested at a plurality of second testing points.

At step 510, a third battery cell of the plurality of battery cells is configured to be tested at a plurality of third testing points.

The first battery cell, the second battery cell and the third battery cell are tested concurrently for generating an OCV-SOC curve. The plurality of first testing points, the plurality of second testing points and the plurality of third testing points are arranged in an alternate manner.

The method further comprises characterizing each battery cell to obtain corresponding SOC testing results based on the initial capacity obtained in the preliminary discharge/charge cycle, calculating an updated capacity of each battery cell based on the corresponding SOC testing results, and recalculating SOC testing results of each battery cell based on the updated capacity.

The method further comprises during the preliminary discharge/charge cycle, discharging each battery cell from an SOC of 100% to an SOC of 0%, and charging each battery cell from the SOC of 0% to the SOC of 100%.

The method further comprises for a battery cell of the plurality of battery cells, obtaining a plurality of OCV testing results by applying a voltage relaxation method, wherein at each testing point, the battery cell is discharged to a corresponding SOC value, and an OCV of the battery cell at the corresponding SOC value is measured after resting the battery cell for a predetermined period.

The method further comprises obtaining a plurality of calibration SOC testing results through discharging the plurality of battery cells to a same OCV, and determining whether the plurality of calibration SOC testing results is evenly distributed. If the plurality of calibration SOC testing results is evenly distributed, an average value of the plurality of calibration SOC testing results is used to replace the plurality of calibration SOC testing results to reset SOC integration errors. If the plurality of calibration SOC testing results is unevenly distributed, deviated SOC testing results are deleted, and SOC testing results adjacent to the deviated SOC testing results are recalculated.

The method further comprises obtaining a plurality of OCV testing results and a plurality of SOC testing results for each battery cell of the plurality of battery cells, obtaining an OCV-SOC curve for each battery cell based on the plurality of OCV testing results and the plurality of SOC testing results, and filtering out OCV testing results deviated from adjacent OCV testing results.

The method further comprises generating a plurality of OCV-SOC curves for the plurality of battery cells, and merging the plurality of OCV-SOC curves to obtain the OCV-SOC curve after filtering out the OCV testing results deviated from the adjacent OCV testing results.

Figure 6:
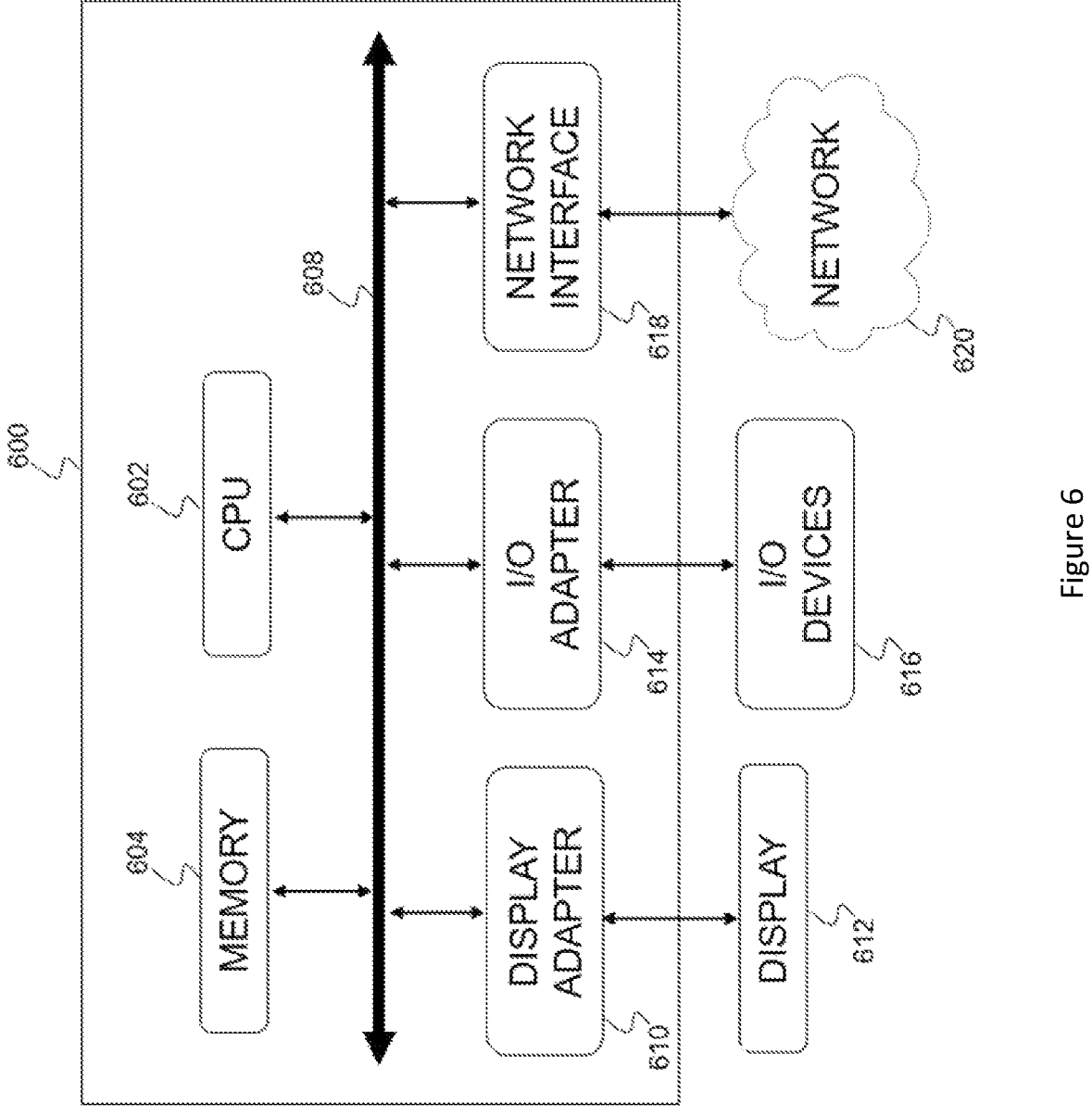
FIG. 6 illustrates a block diagram of a processing system in accordance with various embodiments of the present disclosure.

FIG. 6 illustrates a block diagram of a processing system in accordance with various embodiments of the present disclosure. The processing system 600 depicts a general-purpose platform and the general components and functionality that may be used to implement portions of the embodiment SOC estimation apparatus and/or an external computer or processing device interfaced to the embodiment SOC estimation apparatus. For example, processing system 600 may be used to implement a portion of control circuit 110 shown in FIG. 1. In some embodiments, processing system 600 may be used to determine and evaluate measured parameters, as well as determine the OCV-SOC curve used in SOC estimation applications based on the measured parameters.

Processing system 600 may include, for example, a central processing unit (CPU) 602, and memory 604 connected to a bus 608, and may be configured to perform the processes discussed above. The processing system 600 may further include, if desired or needed, a display adapter 610 to provide connectivity to a local display 612 and an input-output (I/O) Adapter 614 to provide an input/output interface for one or more input/output devices 616, such as a mouse, a keyboard, flash drive or the like.

The processing system 600 may also include a network interface 618, which may be implemented using a network adaptor configured to be coupled to a wired link, such as a network cable, USB interface, or the like, and/or a wireless/cellular link for communications with a network 620. The network interface 618 may also comprise a suitable receiver and transmitter for wireless communications. It should be noted that the processing system 600 may include other components. For example, the processing system 600 may include hardware components power supplies, cables, a motherboard, removable storage media, cases, and the like if implemented externally. These other components, although not shown, are considered part of the processing system 600. In some embodiments, processing system 600 may be implemented on a single monolithic semiconductor integrated circuit and/or on the same monolithic semiconductor integrated circuit as other disclosed system components.

In an embodiment, the processing system 600 shown in FIG. 6 may be implemented as an SOC estimation system for a battery. The memory 604 is configured to store a program for generating the OCV-SOV curve. The CPU 602 is configured to execute the program stored in the memory to perform the SOC estimation method for a battery described in the above embodiments.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for characterizing a plurality of battery cells comprising:
   configuring a first battery cell of the plurality of battery cells to be tested at a plurality of first testing points; and
   configuring a second battery cell of the plurality of battery cells to be tested at a plurality of second testing points, wherein the first battery cell and the second battery cell are tested concurrently, and the plurality of first testing points and the plurality of second testing points are arranged in an alternate manner in a range from the plurality of battery cells in a fully charged state to the plurality of battery cells in a fully depleted state.

2. The method of claim 1, further comprising:
   configuring a third battery cell of the plurality of battery cells to be tested at a plurality of third testing points, wherein the first battery cell, the second battery cell and the third battery cell are tested concurrently, and the plurality of first testing points, the plurality of second testing points and the plurality of third testing points are arranged in another alternate manner.

3. The method of claim 2, wherein:
   the plurality of first testing points are obtained by dividing a state of charge (SOC) of the first battery cell in a unit of 7.5% between 97.5% and 0% of the SOC of the first battery cell;

the plurality of second testing points are obtained by dividing an SOC of the second battery cell in a unit of 7.5% between 95% and 5% of the SOC of the second battery cell; and the plurality of third testing points are obtained by dividing an SOC of the third battery cell in a unit of 7.5% between 92.5% and 2.5% of the SOC of the third battery cell.

4. The method of claim 1, further comprising:

prior to characterizing the plurality of battery cells, applying a preliminary discharge/charge cycle to the plurality of battery cells; and calculating an initial capacity of each battery cell based on testing results of the preliminary discharge/charge cycle.

5. The method of claim 4, further comprising:

characterizing the first battery cell using the plurality of first testing points to obtain a plurality of SOC testing results based on the initial capacity obtained in the preliminary discharge/charge cycle;

after characterizing the first battery cell, calculating an updated capacity of the first battery cell based on the plurality of SOC testing results; and recalculating the plurality of SOC testing results based on the updated capacity of the first battery cell.

6. The method of claim 1, further comprising:

prior to characterizing the plurality of battery cells, applying multiple small current discharge/charge cycles to the plurality of battery cells, wherein as a result of applying the multiple small current discharge/charge cycles to the plurality of battery cells, initial voltage deviations of the plurality of battery cells are controlled within a predetermined voltage deviation range.

7. The method of claim 1, further comprising:

configuring a third battery cell of the plurality of battery cells to be tested at a plurality of third testing points;

placing a first calibration testing point in the plurality of first testing points;

placing a second calibration testing point in the plurality of second testing points; and placing a third calibration testing point in the plurality of third testing points, wherein the first calibration testing point, the second calibration testing point and the third calibration testing point are of a same open circuit voltage (OCV).

8. The method of claim 7, further comprising:

obtaining a first SOC of the first battery cell through discharging the first battery cell to the same open circuit voltage;

obtaining a second SOC of the second battery cell through discharging the second battery cell to the same open circuit voltage;

obtaining a third SOC of the third battery cell through discharging the third battery cell to the same open circuit voltage; and determining whether the first SOC, the second SOC and the third SOC are evenly distributed, wherein:

if the first SOC, the second SOC and the third SOC are evenly distributed, an average value of the first SOC, the second SOC and the third SOC is used to replace the first SOC, the second SOC and the third SOC to reset SOC integration errors in subsequent SOC characterization steps; and if the first SOC, the second SOC and the third SOC are unevenly distributed, a deviated SOC is deleted and adjacent SOC testing results are recalculated.

9. The method of claim 1, further comprising:

configuring a third battery cell of the plurality of battery cells to be tested at a plurality of third testing points;

obtaining a plurality of first OCV testing results and a plurality of first SOC testing results through testing the first battery cell at the plurality of first testing points;

obtaining a plurality of second OCV testing results and a plurality of second SOC testing results through testing the second battery cell at the plurality of second testing points;

obtaining a plurality of third OCV testing results and a plurality of third SOC testing results through testing the third battery cell at the plurality of third testing points;

obtaining a first OCV-SOC curve characterizing a OCV and SOC relationship of the first battery cell based on the plurality of first OCV testing results and the plurality of first SOC testing results;

obtaining a second OCV-SOC curve characterizing a OCV and SOC relationship of the second battery cell based on the plurality of second OCV testing results and the plurality of second SOC testing results;

obtaining a third OCV-SOC curve characterizing a OCV and SOC relationship of the third battery cell based on the plurality of third OCV testing results and the plurality of third SOC testing results;

filtering out OCV testing results deviated from adjacent OCV testing results; and merging the first OCV-SOC curve, the second OCV-SOC curve and the third OCV-SOC curve into a single OCV-SOC curve based on a linear interpolation.

10. A method comprising:

applying a preliminary discharge/charge cycle to a plurality of battery cells to obtain an initial capacity of each battery cell;

applying multiple small current discharge/charge cycles to the plurality of battery cells to minimize initial voltage deviations of the plurality of battery cells;

configuring a first battery cell of the plurality of battery cells to be tested at a plurality of first testing points;

configuring a second battery cell of the plurality of battery cells to be tested at a plurality of second testing points; and configuring a third battery cell of the plurality of battery cells to be tested at a plurality of third testing points, wherein the first battery cell, the second battery cell and the third battery cell are tested concurrently for generating an OCV-SOC curve, and the plurality of first testing points, the plurality of second testing points and the plurality of third testing points are arranged in an alternate manner.

11. The method of claim 10, further comprising:

characterizing each battery cell to obtain corresponding SOC testing results based on the initial capacity obtained in the preliminary discharge/charge cycle;

calculating an updated capacity of each battery cell based on the corresponding SOC testing results; and recalculating SOC testing results of each battery cell based on the updated capacity.

12. The method of claim 10, further comprising:

during the preliminary discharge/charge cycle, discharging each battery cell from an SOC of 100% to an SOC of 0%, and charging each battery cell from the SOC of 0% to the SOC of 100%.

13. The method of claim 10, further comprising:

for a battery cell of the plurality of battery cells, obtaining a plurality of OCV testing results by applying a voltage relaxation method, wherein at each testing point, the battery cell is discharged to a corresponding SOC value, and an OCV of the battery cell at the corresponding SOC value is measured after resting the battery cell for a predetermined period.

14. The method of claim 10, further comprising:

obtaining a plurality of calibration SOC testing results through discharging the plurality of battery cells to a same OCV; and determining whether the plurality of calibration SOC testing results is evenly distributed.

15. The method of claim 14, wherein:

if the plurality of calibration SOC testing results is evenly distributed, an average value of the plurality of calibration SOC testing results is used to replace the plurality of calibration SOC testing results to reset SOC integration errors.

16. The method of claim 14, wherein:

if the plurality of calibration SOC testing results is unevenly distributed, deviated SOC testing results are deleted, and SOC testing results adjacent to the deviated SOC testing results are recalculated.

17. The method of claim 10, further comprising:

obtaining a plurality of OCV testing results and a plurality of SOC testing results for each battery cell of the plurality of battery cells;

obtaining an OCV-SOC curve for each battery cell based on the plurality of OCV testing results and the plurality of SOC testing results; and filtering out OCV testing results deviated from adjacent OCV testing results.

18. The method of claim 17, further comprising:

generating a plurality of OCV-SOC curves for the plurality of battery cells; and merging the plurality of OCV-SOC curves to obtain the OCV-SOC curve after filtering out the OCV testing results deviated from the adjacent OCV testing results.

19. An apparatus comprising:

a voltage sensor configured to measure OCV values of each battery cell of a plurality of battery cells configured to be tested concurrently in a chamber;

a current sensor configured to measure current values of each battery cell of the plurality of battery cells; and a control circuit configured to receive measured OCV values and measured current values of the plurality of battery cells, generate an OCV-SOC curve for each battery cell and merge OCV-SOC curves of the plurality of battery cells into a single OCV-SOC curve representing the plurality of battery cells from a fully charged state to a fully depleted state.

20. The apparatus of claim 19, wherein the control circuit is configured such that:

a preliminary discharge/charge cycle is applied to the plurality of battery cells to obtain an initial capacity of each battery cell;

multiple small current discharge/charge cycles are applied to the plurality of battery cells to minimize initial voltage deviations of the plurality of battery cells;

a first battery cell of the plurality of battery cells is tested at a plurality of first OCV-SOC testing points;

a second battery cell of the plurality of battery cells is tested at a plurality of second OCV-SOC testing points; and a third battery cell of the plurality of battery cells is tested at a plurality of third OCV-SOC testing points, wherein the plurality of first OCV-SOC testing points, the plurality of second OCV-SOC testing points and the plurality of third OCV-SOC testing points are arranged in an alternate manner.

\* \* \* \* \*